United States Patent [19]

Tsutsumi et al.

[11] Patent Number: 4,913,285
[45] Date of Patent: Apr. 3, 1990

[54] WATER-AND-DUST-PROOF PUSH-BUTTON SWITCH HOUSING DUMMY TERMINAL FOR AIR VENTING

[75] Inventors: Jyoji Tsutsumi; Yoichi Hattori, both of Iwaki, Japan

[73] Assignee: Alps Electronic Co., Ltd., Tokyo, Japan

[21] Appl. No.: 281,950

[22] Filed: Dec. 5, 1988

Related U.S. Application Data

[63] Continuation of Ser. No. 119,812, Nov. 12, 1987, abandoned.

[30] Foreign Application Priority Data

Mar. 9, 1987 [JP] Japan .................................. 62-34286
Jul. 28, 1987 [JP] Japan ................................. 62-114594

[51] Int. Cl.⁴ .............................................. H01H 9/02
[52] U.S. Cl. .................................... 200/306; 200/406
[58] Field of Search ................... 200/306, 302.1, 406;
361/383, 381; 439/148, 149, 150; 29/622
200/406

[56] References Cited

U.S. PATENT DOCUMENTS 4,331,851  5/1982  Johnson ............................. 200/517
4,398,069  8/1983  Olsson ................................ 200/6 R Primary Examiner—Renee S. Luebke
Attorney, Agent, or Firm—Guy W. Shoup; Stephen L. Malaska

[57] ABSTRACT

A push-button switch of a water- and dust-proof structure wherein a good operating force characteristic is always assured. The push-button switch has a dummy terminal which is not to be directly soldered to a wiring pattern and is provided at a location of the push-button switch to which flux which appears when a terminal is being soldered to the wiring pattern does not come around. When the switch is soldered to a printed circuit board for the wiring pattern, flux may not possibly enter a gap between a case of the switch and the dummy terminal. After mounting of the switch on the printed circuit board, communication of air between inside and outside the case is assured by the gaps so that the inside of the case is maintained at an equal pressure with external air.

5 Claims, 4 Drawing Sheets

WATER-AND-DUST-PROOF PUSH-BUTTON SWITCH HOUSING DUMMY TERMINAL FOR AIR VENTING

This application is a continuation of application Ser. No. 119,812, filed Nov. 12, 1987, now abandoned.

BACKGROUND OF THE INVENTION

This invention relates to a push-button switch, and more particularly to a push-button switch of a water-and dust proof structure having an enclosing insulating case.

In recent years, electronic appliances have been reduced in size and weight, and simultaneously the density of parts mounted on a printed circuit board has been increased progressively. Accordingly, a push-button switch of the face mounted type is frequently used which is first placed at a predetermined location of a printed circuit board to which cream solder has been applied in advance and is then heated in a reflow furnace or the like in order to solder connecting terminals thereof to a wiring pattern of the printed circuit board. As one of such push-button switches of the face mounted type, a push-button switch of a water- and dust-proof structure wherein contact portions are enclosed in order to improve the reliability has been already provided and is disclosed, for example, in Japanese Patent Laid-Open No. 61-142617.

FIGS. 10 and 11 show an exemplary one of conventional push-button switches of such a water- and dust-proof structure. The push-button switch shown includes two metal pieces embedded in a spaced relationship in a heat resisting insulating case 1 having an opening formed at the top thereof. One of the metal pieces is partially exposed from an inner face of a bottom wall of the insulating case 1 to form a fixed contact 2 and the other metal piece is also partially exposed from the bottom wall inner face of the insulating case 1 to form another fixed contact 3 while end portions of both the metal pieces are exposed outside and extend outwardly from a side wall of the insulating case 1 to form a pair of connecting terminals 4. A flattened bowl-shaped spring disk 5 serving as a movable contact is placed on the fixed contact 2 such that, when the push-button switch is not operated, it is spaced by a little distance from the fixed contact 3 at the center of the insulating case 1. A stem 6 is received for up and down movement in the top opening of the insulating case 1. The stem 6 is made of a like material to the insulating case 1 and has a semi-spherical projection 6a formed on a lower face thereof and normally held in contact with the spring plate 5. The stem 6 is covered at an upper face thereof by a heat resisting film 7 for water- and dust-proof which closes the top opening of the insulating case 1. A holding plate 8 is located on an upper face of the heat resisting film 7 and secured to the insulating case 1 for limiting upward movement of the stem 6. The holding plate 8 is made of, for example, a solder-plated stainless steel plate and has a perforation 8a formed at a central portion thereof. Thus, an operating area 6b of the stem 6 covered by the heat resisting film 7 extends upwardly through the perforation 8a of the holding plate 8. The holding plate 8 partially extends laterally and then downwardly to form a grounding terminal 9.

In mounting the push-button switch having such a construction as described above, it is first placed at a predetermined location of a wiring pattern 11 on a printed circuit board 10 to which cream solder has been applied in advance and is then heated in a reflow furnace to a temperature higher than 200° C. so as to melt the cream solder. Consequently, after cooling of the push-button switch, the connecting terminals 4 and the grounding terminal 9 are connected to the wiring pattern 11 by the solder 20 as seen in FIG. 11. If the operating portion 6b of the stem 6 of the push-button switch which has been mounted on the printed circuit board 10 in this manner is manually operated to depress the stem 6, the spring plate 5 is resiliently yielded downwardly until it is contacted with the fixed contact 3, thereby electrically interconnecting both the fixed contacts 2, 3 to establish a closed state of the push-button switch. Then, if the pressing force upon the operating portion 6b of the stem 6 is removed, then the spring plate 5 will be spaced away from the fixed contact 3 by its own resiliency, thereby restoring an open state of the push-button switch.

By the way, in the push-button switch of a water- and dust-proof structure described above, fine gaps 4a are defined between the insulating case 1 and an embedded portion of each of the connecting terminals 4 which are insert-molded in the insulating case 1. Accordingly, when the push-button switch to be mounted is heated in a reflow furnace or the like and consequently air within the insulating case 1 expands, the air will flow out through the gaps 4a. Then, as the temperature of the push-button switch drops after soldering, the air within the insulating case 1 contracts, but thereupon flux contained in the cream solder may enter and close the gaps 4a thereby to obstruct external air from flowing into an internal spacing of the push-button switch through the gaps 4a. If this actually occurs, the pressure of the air within the push-button switch will be lower than the pressure of air outside the push-button switch, and consequently the stem 6 will have an initial position lower than an aimed initial position therefor and hence have an undesirably small stroke of operation, resulting in deterioration of the operating force characteristic of the push-button switch.

SUMMARY OF THE INVENTION

Accordingly, it is an object of the present invention to provide a push-button switch wherein a good operating force characteristic is always assured eliminating the problems of the prior art push-button switches described above.

In order to attain the object, according to the present invention, a push-button switch of a water- and dust proof structure having a terminal to be directly soldered to a wiring pattern on a printed circuit board on which the push-button switch is placed in order to mount the push-button switch on the printed circuit board is constituted such that a dummy terminal which is not to be directly soldered to the wiring pattern is provided at a location of the push-button switch to which flux which appears when the first-mentioned terminal is being soldered to the wiring pattern does not come around.

Thus, since the push-button switch of the present invention has at least one terminal which is not to be soldered to a wiring pattern and is provided at a location to which flux which appears when a terminal is being soldered to the wiring pattern does not come around, when the switch is soldered, it is sufficiently spaced away from a cream solder portion of the wiring pattern. Accordingly, there is no possibility that the flux may enter a gap between the case and the contact terminal. Further, even after the switch has been mounted on a printed circuit board, communication of air between inside and outside the case of the push-button switch is assured and consequently the inside of the case is maintained at a pressure equal to the pressure of external air. Accordingly, good operating condition of the push-button switch is maintained.

The above and other objects, features and advantages of the present invention will become apparent from the following description and the appended claims, taken in conjunction with the accompanying drawings.

DETAILED DESCRIPTION OF THE PREFERRED EMBODIMENTS

Figure 1:
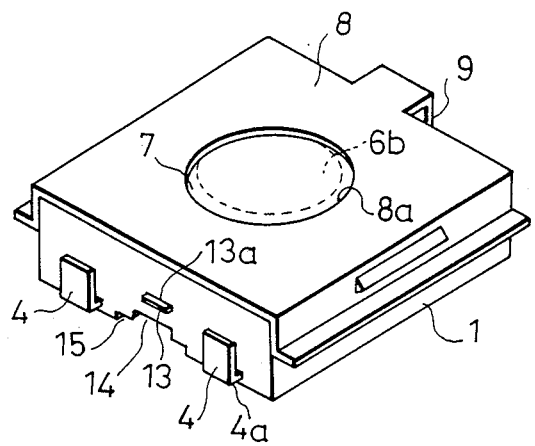
FIG. 1 is a perspective view of a push-button switch showing a first preferred embodiment of the present invention.
Figure 2:
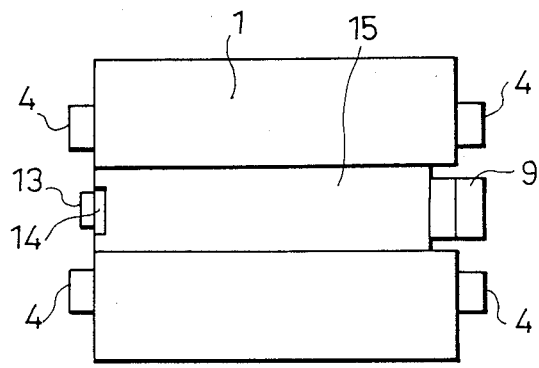
FIG. 2 is a bottom plan view of the push-button switch of FIG. 1.
Figure 3:
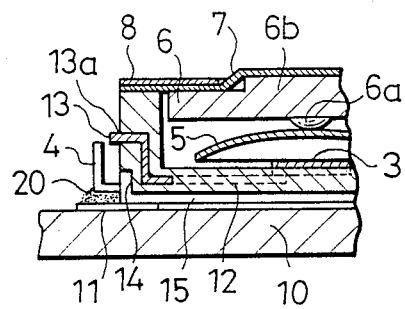
FIG. 3 is a partial cross sectional view of the push-button switch of FIG. 1 in a position mounted on a printed circuit board.
Figure 10:
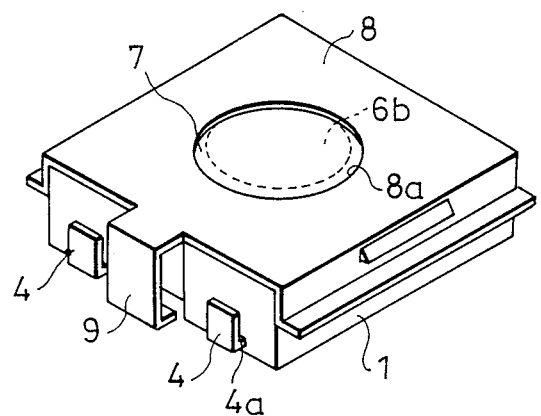
FIG. 10 is a perspective view of an exemplary one of conventional push-button switches.
Figure 11:
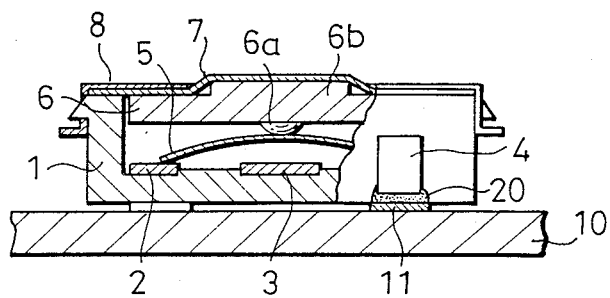
FIG. 11 is a partial sectional view of the push-button switch of FIG. 10 in a position mounted on a printed circuit board.

Referring first to FIGS. 1 to 3, a push-button switch according to a first embodiment of the present invention is shown. In these figures, like parts or elements are denoted by like reference numerals to those of FIGS. 10 and 11. The push-button switch of a water- and dust-proof structure shown has a similar construction to the conventional push-button switch shown in FIGS. 10 and 11 in that a metal piece 12 is embedded in an insulating case 1 and has a portion exposed from an inner face of a bottom wall of the insulating case 1 to form a fixed contact 3 and a pair of portions exposed outside and extending outwardly from a side wall of the insulating case 1 to form a pair of connecting terminals 4, but is different in that the metal piece 12 has a further portion exposed outside and extending outwardly from the side wall of the insulating case 1 at a location sufficiently spaced from the connecting terminals 4 and a grounding terminal 9 to form a dummy terminal 13. More particularly, upon insert-molding of the insulating case 1 in which the metal piece 12 is to be embedded, a dummy terminal 13 to which no element is to be soldered is provided, in addition to a pair of connecting terminals 4 which are to be soldered to a wiring pattern 11 of a printed circuit board 10, so as to extend from a side wall of the insulating case 1. Fine gaps 13a defined between the insulating case 1 and a portion of the dummy terminal 13 embedded in the insulating case 1 act to permit communication of air therethrough. A recess 14 is formed at a location of the edge formed by the meeting of the bottom wall and the side wall of the insulating case 1 below the dummy terminal 13, and a recessed groove 15 is formed on an outer face of the bottom wall of the insulating case 1 in a contiguous communicating relationship to the recess 14. The recess 14 and the recessed groove 15 act so as to allow flux upon soldering of the connecting terminals 4 to stay therein. Construction of the remaining portion of the push-button switch not particularly described above is similar to that of the conventional arrangement of FIGS. 10 and 11.

In mounting the push-button switch described above, it is first placed at a predetermined location of a wiring pattern 11 on a printed circuit board 10 to which cream solder has been applied in advance and is then heated in a reflow furnace in order to solder the connecting terminals 4 and the grounding terminal 9 to the wiring pattern 11 as at 20. Upon such soldering, however, flux contained in the cream solder will stay within the recessed groove 15 and/or the recess 14 and not reach the dummy terminal 13. In particular, most of the flux sticking to the insulating case 1 will stay within the recessed groove 15, and even if some of the flux comes around to the side on which the dummy terminal 13 is located, it will stay within the recess 14. Consequently, the flux cannot reach the dummy terminal 13 which is located at a position sufficiently spaced away from the connecting terminals 4 and the grounding terminal 9 to be soldered. Besides, since the viscosity of the flux increases and the fluidity decreases as the termperature thereof drops after soldering, there is no possibility that the gaps 13a between the embedded portion of the dummy terminal 13 and the insulating case 1 may be closed by the flux at all. Further, the dummy terminal 13 is part of the metal piece 12 and the gaps 13a communicate with the internal spacing of the insulating case 1 as shown in FIG. 3, communication of air between inside and outside the insulating case 1 is always assured. Accordingly, as air within the insulating case 1 contracts due to dropping of the temperature after soldering, external air is admitted into the inside spacing of the insulating case 1 by the gaps 13a. Therefore, a difference in pressure of air between inside and outside the insulating case 1 which will cause a variation in stroke of the stem 6 of the push-button device does not appear, and consequently a good operating force characteristic can always be assured.

It is to be noted that the push-button switch of the water- and dust-proof structure described above exhibits an advantage that a stabilized operating force characteristic can be anticipated in a wide variety of circumstances because there is no possibility that a difference in pressure of air between inside and outside the insulating case 1 may appear even if the pressure of external air varies as at a high location.

Figure 4:
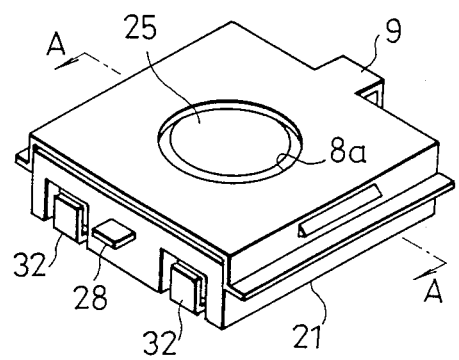
FIG. 4 is a perspective view of another push-button switch showing a second preferred embodiment of the present invention.
Figure 5:
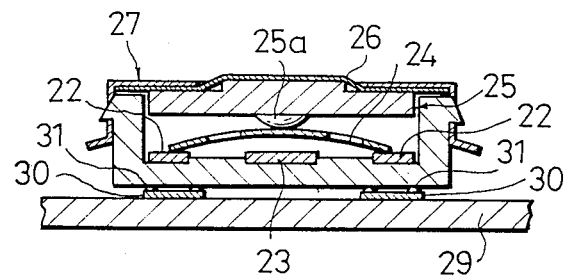
FIG. 5 is a cross sectional view taken along line A—A of FIG. 4 showing the push-button switch of FIG. 4 mounted on a printed circuit board.
Figure 6:
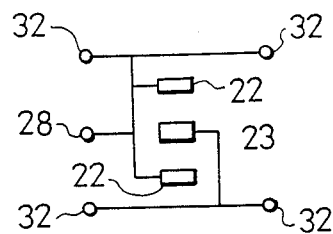
FIG. 6 is a wiring circuit diagram of the push-button switch of FIG. 4.

Referring now to FIGS. 4 to 6, a push-button switch according to a second preferred embodiment of the present invention is shown. The push-button switch shown is similar in construction to the push-button switch of the first embodiment shown in FIGS. 1 to 3 in that it includes an insulating case 21, a pair of fixed contacts 22, 23 embedded in an inner face of a bottom wall of the insulating case 21, a flattened dome-shaped movable contact 24 placed on the fixed contact 22, a stem 25 having a projection 25a formed thereon, a heat resisting film 26 mounted on an upper face of the insulating case 21 and the stem 25, and a holding plate 27 mounted on the heat resisting film 26, but is different in that the insulating case 21 is made flat and hence has no recess or a like formation formed at a portion thereof below a dummy terminal 28 which extends from a side wall of the insulating case 21.

If the push-button switch is placed on a wiring pattern 30 of a printed circuit board 29 to which cream solder has been applied and is heated to a temperature within a high temperature atmosphere (higher than 200° C.), contact terminals 32 are soldered to the wiring pattern 30 by melted solder 31.

In this instance, since the dummy terminal 28 is greatly spaced from the wiring pattern 30 and the contact terminals 32, the solder 31 will not come around to the dummy terminal 28. Further, since high temperature flux of a low viscosity will not reach a boundary between the insulating case 21 and the dummy terminal 28 extending from the insulating case 21 even if it is scattered from around the solder 31, the flux will not be absorbed into gaps between the insulating case 21 and the dummy terminal 28 when the push-button switch is cooled after completion of the soldering, thereby assuring the ventilation through the gaps. Accordingly, the inside of the insulating case 21 is maintained at a normal pressure, and hence the push-button switch mounted on the printed curcuit board 29 makes an opening and closing operation always in a good condition by operation of the stem 25.

Figure 7:
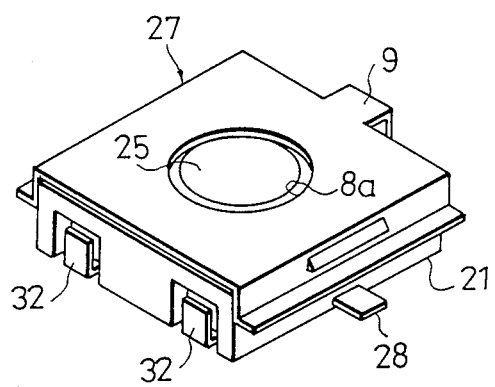
FIG. 7 is a perspective view of a further push-button switch showing a third preferred embodiment of the present invention.

FIG. 7 shows a push-button switch according to a third embodiment of the present invention. In FIG. 7, like parts or elements are denoted by like reference numerals to those of the second embodiment shown in FIGS. 4 to 6, and overlapping description thereof will be omitted herein.

In the push-button switch of the third embodiment, a dummy terminal 28 is located at a suitable location of any side wall of an insulating case 21 other than a side wall on which a pair of contact terminals 32 are located.

Also in the present arrangement, the dummy terminal 28 is greatly spaced from the contact terminals 32 and any cream solder portion of the insulating case 21. Accordingly, similar effects to those of the second embodiment can be anticipated.

Figure 8:
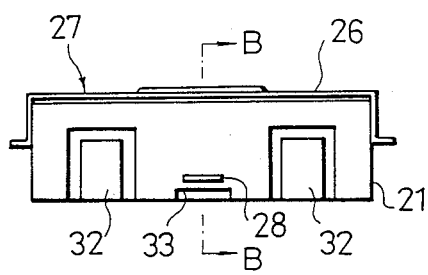
FIG. 8 is a perspective view of a still further push-button switch showing a fourth preferred embodiment of the present invention.
Figure 9:
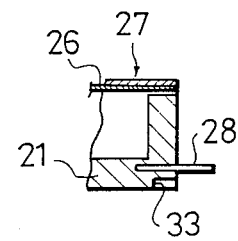
FIG. 9 is a cross sectional view taken along line B—B of FIG. 8.

FIGS. 8 and 9 illustrate a push-button switch according to a fourth preferred embodiment of the present invention, and like parts or elements are denoted by like reference numerals to those of the second embodiment, and overlapping description thereof will be omitted herein.

In the push-button device of the fourth embodiment, a dummy terminal 28 is located a little above a lower end of a side wall on which a pair of contact terminals 32 are located, and a recess 33 is formed at a portion of an insulating case 21 below the dummy terminal 28.

With such a construction, cream solder which might be present at a position below the dummy terminal 28 will not come around to the dummy terminal 28. Besides, since the distance between the dummy terminal 28 and cream solder on a surface of the insulating case 21 is remarkably long, high temperature flux of a low viscosity upon soldering will not be scattered to a root portion of the dummy terminal 28.

As apparent from the foregoing description, according to the present invention, a push-button switch has at least one contact terminal greatly spaced from other terminals which are to be directly soldered to a wiring pattern. Accordingly, when the push-button switch is soldered to a printed circuit board, there is no possibility that flux may enter a gap between a case of the push-button switch and the contact terminal. Also after the push-button switch has been mounted on the printed circuit board, communication of air between inside and outside the case of the push-button switch is assured and consequently the inside of the case is maintained at an equal pressure with external air. Accordingly, good operating condition of the push-button switch is maintained.

Having now fully described the invention, it will be apparent to one of ordinary skill in the art that many changes and modifications can be made thereto without departing from the spirit and scope of the invention as set forth herein.

What is claimed is:

1. In a push button switch having a water- and dust-proof construction comprising an insulating case with an open top and closed bottom and sidewalls, a flexible sealing member for sealing the open top of the insulating case, a movable stem having an inner side and having an outer side in constraining contact with the inner surface of said flexible sealing member, a first electrical contact fixed on said bottom wall of said insulating case, a pair of electrical terminals having ends extending through a side or bottom wall of said insulating case to be soldered to an external printed circuit board, a movable second electrical contact disposed on said pair of electrical terminals and in constraining contact with the inner side of said stem and movable upon application of an external depressing force thereto from outside said insulating case to close an electrical circuit when said movable electrical contact contacts said first electrical contact;

the improvement comprising:
a dummy terminal extending through one side wall and forming a fine air gap through one said wall leading from the outside into the inside of said insulating case, said dummy terminal being positioned in said one side wall and spaced from said electrical terminals so that solder applied to said pair of electrical terminals does not reach said dummy terminal, whereby said fine air gap allows communication of air into the insulating case to equalize the air pressure between the inside and the outside of the insulating case while dust and water may not enter the case.

2. A push-button switch in accordance with claim 1, wherein said electrical terminals have their external ends disposed through one side wall near the bottom wall of said insulating case, and said dummy terminal is located at an upper portion of the same one side wall spaced apart from said electrical terminal ends.

3. A push-button switch in accordance with claim 2, wherein said electrical terminal ends are spaced laterally apart toward opposite lateral ends of said one side wall, said dummy terminal is located at the upper portion of said one side wall at a central position between said electrical terminals ends, and a recess is formed along a bottom edge between said one side wall and the bottom wall at the central position of said one side wall for preventing solder applied to said electrical terminal ends from flowing to said dummy terminal.

4. A push-button switch in accordance with claim 1, wherein said dummy terminal is located in one side wall spaced apart from the bottom wall, and a recess is formed along a bottom edge between said one side wall and the bottom wall below the position of said dummy terminal for preventing solder applied to said electrical terminal ends from flowing to said dummy terminal.

5. A push-button switch in accordance with claim 1, wherein said dummy terminal is located in one side wall of said insulating case different from a side wall in which the electrical terminals to be soldered are located.

* * * * *